US010627787B2

(12) United States Patent
Zhu et al.

(10) Patent No.: US 10,627,787 B2
(45) Date of Patent: Apr. 21, 2020

(54) MANUFACTURING PROCESS CONTROL BASED ON MULTI-MODALITY AND MULTI-RESOLUTION TIME SERIES DATA

(71) Applicant: International Business Machines Corporation, Armonk, NY (US)

(72) Inventors: Yada Zhu, Westchester, NY (US); Jayant R. Kalagnanam, Briarcliff Manor, NY (US); Xuan Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 15/800,129

(22) Filed: Nov. 1, 2017

(65) Prior Publication Data

US 2019/0129365 A1 May 2, 2019

(51) Int. Cl.
*G05B 13/02* (2006.01)
*G05B 23/02* (2006.01)
*G01R 31/28* (2006.01)
*H01L 21/66* (2006.01)
*G06F 3/06* (2006.01)

(52) U.S. Cl.
CPC ....... *G05B 13/026* (2013.01); *G01R 31/2831* (2013.01); *G05B 23/0221* (2013.01); *G05B 23/0297* (2013.01); *H01L 22/14* (2013.01); *G05B 2219/31459* (2013.01); *G06F 3/067* (2013.01); *G06F 3/0619* (2013.01)

(58) Field of Classification Search
None
See application file for complete search history.

(56) References Cited

U.S. PATENT DOCUMENTS

| | | | |
|---|---|---|---|
| 5,089,093 A | * | 2/1992 | Blatch .................. C25C 3/20 205/336 |
| 9,176,183 B2 | | 11/2015 | Zhu et al. |
| 2001/0032029 A1 | | 10/2001 | Kauffman |
| 2010/0057237 A1 | | 3/2010 | Kettaneh et al. |
| 2010/0191361 A1 | | 7/2010 | McCready et al. |
| 2011/0022375 A1 | | 1/2011 | Odille et al. |
| 2011/0202160 A1 | | 8/2011 | Moyne |
| 2011/0212405 A1 | * | 9/2011 | Mi .......................... C01B 25/04 432/13 |
| 2014/0107828 A1 | | 4/2014 | Zhu et al. |
| 2015/0242125 A1 | | 8/2015 | Benhase et al. |

(Continued)

OTHER PUBLICATIONS

Ding et al., "Distributed sensing for quality and productivity improvements", IEEE Transactions on automation science and engineering 3.4 (2006): 344-359.

(Continued)

*Primary Examiner* — Ziaul Karim
(74) *Attorney, Agent, or Firm* — Jospeh P. Curcuru; Gilbert Harmon, Jr.

(57) ABSTRACT

Embodiments describing an approach to aligning multiple time series. Calculating an indicator function. Estimating a coefficient vector based on the indicator function. Updating the coefficient vector. Determining if a change in the coefficient vector is less than a predetermined value, and responsive to determining the change in the coefficient vector is less than the predetermined value, outputting a target time series for controlling aluminum smelting.

20 Claims, 5 Drawing Sheets

(56) References Cited

U.S. PATENT DOCUMENTS

2019/0093187 A1  3/2019  Lee et al.

OTHER PUBLICATIONS

Iffert, Martin, "Aluminium Smelting Cell Control and Optimisation", A thesis, Doctor of Philosophy, School of Chemical Sciences and Engineering, University of South Wales, Sydney Australia, Nov. 2007, 278 pages.

Fontes et al., "Estimation of Aluminium Fluoride Concentration in Aluminium Reduction Cells through a Soft Sensors Approach", H. Yin et al. (Eds.): Ideal 2012, LNCS 7435, pp. 303-311, 2012. © Springer-Verlag Berlin Heidelberg 2012.

Pereira et al., "Fuzzy Control Applied to Aluminum Smelting", InTech, Fuzzy Logic—Controls, Concepts, Theories and Applications, ISBN: 978-953-51/0396-7, <http://www.intechopen.com/books/fuzzy-logic-controls-conceptstheories-and-applications/fuzzy-control-applied-to-aluminium-smelting-process>, 2012, 27 pages.

Zhu et al., "A System and Predictive Modeling Method for Smelting Process Control Based on Multi-Source Information With Heterogeneous Relatedness", U.S. Appl. No. 15/271,367, filed Sep. 21, 2016, 52 pages.

"Kriging", Wikipedia, the free encyclopedia, <https://en.wikipedia.org/wiki/Kriging>, last edited Jul. 23, 2017, 10 pages.

Zhu et al., " Manufacturing Process Control Based on Multi-Modality and Multi-Resolution Time Series Data", U.S. Appl. No. 16/589,231, filed Oct. 1, 2019, 28 pages.

IBM Appendix P, list of patents and patent applications treated as related, Filed Herewith, 2 pages.

\* cited by examiner

MANUFACTURING PROCESS CONTROL BASED ON MULTI-MODALITY AND MULTI-RESOLUTION TIME SERIES DATA

BACKGROUND OF THE INVENTION

The present invention relates generally to the field of optimizing manufacturing processes, and more particularly to optimizing aluminum smelting manufacturing based on multi-modality and multi-resolution time series data.

Many complex real applications (e.g., advanced manufacturing process control) involve the collection and modeling of time series data with multi-modality and multi-resolution. A model is built using such data to predict a target time series which is used for process control, quality or yield control of the process outputs. Multi-modality is collected from various resources or types of sensors and reflect various control signals and their responses. For example, Semiconductor manufacturing, which comprises electrical control signal and responses (resistance, voltage, current), pressure control signal and responses (pressure, valve position), and/or temperature control signal. In another example, Aluminum smelting process, which comprises power related control signal and responses, alumina feed related, noise control related, and/or chemical combination related. Multi-resolution can be a time series data obtained with different time resolutions. For example, every 10 seconds, every 5 minutes, and/or every 24 hours.

Current practice comprises: aggregating the high-resolution time series to obtain low-resolution (e.g., aggregating to the same resolution), calculating summary statistics (e.g., mean, median, std, etc.), and/or interpolation (e.g., linear, polynomial, etc.). Limitations to the current practice comprise: the potential risk of smoothing out important signals available only in the high-resolution, and/or bring errors between time series with large resolution difference by imposing assumptions (e.g., interpolate data collected every 24 hours to every 10 seconds). Additionally, currently there is a challenge to integrate the information from different modalities and resolutions into a unified model.

SUMMARY

Embodiments of the present invention disclose a method, a computer program product, and a system for optimizing aluminum smelting control. A method for optimizing aluminum smelting control, the method includes aligning, by one or more processors, multiple time series. Calculating, by the one or more processors, an indicator function. Estimating, by the one or more processors, a coefficient vector based on the indicator function. Updating, by the one or more processors, the coefficient vector. Determining, by the one or more processors, if a change in the coefficient vector is less than a predetermined value, and responsive to determining the change in the coefficient vector is less than the predetermined value, outputting, by the one or more processors, a target time series for controlling aluminum smelting.

A computer program product for optimizing aluminum smelting control, the computer program product includes one or more computer readable storage devices and program instructions stored on the one or more computer readable storage devices, the stored program instructions comprising, program instructions to align multiple time series. Program instructions to calculate an indicator function. Program instructions to estimate a coefficient vector based on the indicator function. Program instructions to update the coefficient vector. Program instructions to determine if a change in the coefficient vector is less than a predetermined value, and responsive to determining the change in the coefficient vector is less than the predetermined value, program instructions to output a target time series for controlling aluminum smelting.

A computer implemented system for optimizing aluminum smelting control, the computer system includes one or more computer processors, one or more computer readable storage devices, program instructions stored on the one or more computer readable storage devices for execution by at least one of the one or more computer processors, the stored program instructions comprising program instructions to align multiple time series. Program instructions to calculate an indicator function. Program instructions to estimate a coefficient vector based on the indicator function. Program instructions to update the coefficient vector. Program instructions to determine if a change in the coefficient vector is less than a predetermined value, and responsive to determining the change in the coefficient vector is less than the predetermined value, program instructions to output a target time series for controlling aluminum smelting.

DETAILED DESCRIPTION

Figure 1:
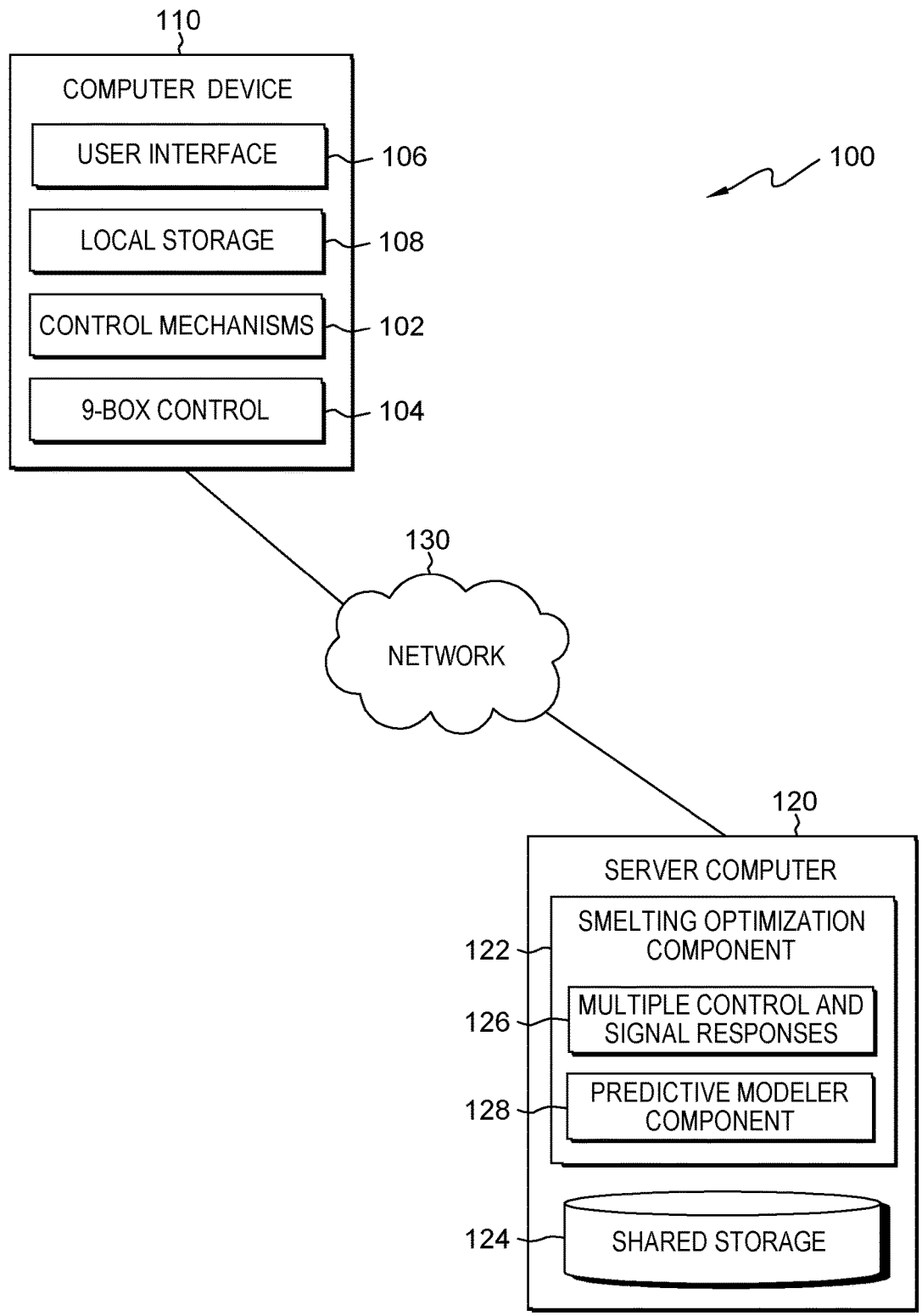
FIG. 1 is a functional block diagram illustrating a distributed data processing environment, in accordance with an embodiment of the present invention.

Embodiments of the present invention enable an integrated approach to jointly model multi-modality and multi-resolution time series for predicting target control variables used in advanced manufacturing process. Additionally, Embodiments of the present invention enable, an integrated approach to jointly model the multi-modality and multi-resolution properties, an optimization approach to reflect both the quality of fit, and a novel regularizer imposing the consistency across multiple modalities and multiple resolutions, and/or an iteration algorithm to balance between computational complexity and iteration complexity for large scale application.

Furthermore, embodiments of the present invention propose advantages and improvements to the field of manufacturing by effectively leveraging information from different modalities compared to simple multiplication, and/or concatenation; effectively leveraging information from different resolutions compared to aggregate to low and same resolution or summary statistics; encouraging prediction consistency across both modalities and resolutions; linearly scaling for large scale application; and improving manufacturing process control in finer granularity, all of which improve the art and field of manufacturing.

Implementation of embodiments of the invention may take a variety of forms, and exemplary implementation details are discussed subsequently with reference to the Figures.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It can also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations can be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

FIG. 1 is a functional block diagram illustrating a distributed data processing environment, generally designated 100, in accordance with one embodiment of the present invention. The term "distributed" as used in this specification describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes mobile device 110, server computer 124, and/or network 130. Network 130 can be, for example, a telecommunications network, a local area network (LAN), a wide area network (WAN), such as the Internet, or a combination of the three, and can include wired, wireless, or fiber optic connections. Network 130 can include one or more wired and/or wireless networks that are capable of receiving and transmitting data, voice, and/or video signals, including multimedia signals that include voice, data, and video information. In general, network 130 can be any combination of connections and protocols that will support communications between computing device 110 and server computer 120, and other computing devices (not shown in FIG. 1) within distributed data processing environment 100.

In various embodiments, computing device 110 can be, but is not limited to, a standalone device, a server, a laptop computer, a tablet computer, a netbook computer, a personal computer (PC), a smart phone, a desktop computer, a smart television, a smart watch, any programmable electronic computing device capable of communicating with various components and devices within distributed data processing environment 100, via network 102 or any combination therein. In general, computing device 110 are representative of any programmable mobile device or a combination of programmable mobile devices capable of executing machine-readable program instructions and communicating with users of other mobile devices via network 130 and/or capable of executing machine-readable program instructions and communicating with server computer 120. In other embodiments, computing device 110 can represent any programmable electronic computing device or combination of programmable electronic computing devices capable of executing machine readable program instructions, manipulating executable machine readable instructions, and communicating with server computer 120 and other computing devices (not shown) within distributed data processing environment 100 via a network, such as network 130.

In various embodiments, computing device 110 includes user interface 106, local storage 108, control mechanisms 102, and/or 9-box control 104. 9-box control 104 is a functional block that issues a series of control signals based on the range of temperature and Alumina Fluoride, (i.e., Low (L), Medium (M), and High (H)) concentration. Control Mechanism 102 is a functional block that can issue variable control signals. In various embodiments, not depicted in FIG. 1, control mechanism 102 comprises power control (e.g., voltage, current, etc.), noise control (e.g., change of resistance, heat, etc.), feed control (e.g., feed the alumina dirt), and/or chemical control (e.g., sodium, silicone, iron, and/or other various alloy's known in the art) subcomponents. Computing device 110 and user interface 106 enable a user to interact with smelting optimization component 122 in various ways, such as sending program instructions, receiving program instructions, data entry, displaying data and/or information, editing data, correcting data, and/or adjusting settings.

User interface (UI) 106 provides an interface to smelting optimization component 122 on server computer 120 for a user of computing device 110. In one embodiment, UI 106 can be a graphical user interface (GUI) or a web user interface (WUI) and can display text, documents, web browser windows, user options, application interfaces, and instructions for operation, and include the information (such as graphic, text, and sound) that a program presents to a user and the control sequences the user employs to control the program. In another embodiment, UI 106 can also be mobile application software that provides an interface between a user of computing device 110 and server computer 120. Mobile application software, or an "app," is a computer program designed to run on smart phones, tablet computers and other mobile devices. In an embodiment, UI 106 enables the user of computing device 110 to send, input, edit, correct, update, receive, and/or display data and/or information (e.g., smelting instructions).

Server computer 120 can be a standalone computing device, a management server, a web server, a mobile computing device, or any other electronic device or computing system capable of receiving, sending, and processing data. In other embodiments, server computer 120 can represent a server computing system utilizing multiple computers as a server system, such as in a cloud computing environment. In another embodiment, server computer 120 can be a laptop computer, a tablet computer, a netbook computer, a personal computer (PC), a desktop computer, a personal digital assistant (PDA), a smart phone, or any other programmable electronic device capable of communicating with computing device 110 and other computing devices (not shown) within distributed data processing environment 100 via network 130. In another embodiment, server computer 120 represents a computing system utilizing clustered computers and components (e.g., database server computers, application server computers, etc.) that act as a single pool of seamless resources when accessed within distributed data processing environment 100. Server computer 120 can include smelting optimization component 122 and shared storage 124. Server computer 120 can include internal and external hardware components, as depicted, and described in further detail with respect to FIG. 4.

Shared storage 124 and local storage 108 can be a data repository and/or a database that can be written to and/or read by one or a combination of smelting optimization component 122, server computer 120 and/or computing devices 110. In the depicted embodiment, shared storage 124 resides on server computer 120. In another embodiment, shared storage 124 can reside elsewhere within distributed data processing environment 100 provided coverage assessment program 110 has access to shared storage 124. A database is an organized collection of data. Shared storage 124 and/or local storage 108 can be implemented with any type of storage device capable of storing data and configuration files that can be accessed and utilized by server computer 120, such as a database server, a hard disk drive, or a flash memory. In other embodiments, shared storage 124 and/or local storage can be hard drives, memory cards, computer output to laser disc (cold storage), and/or any form of data storage known in the art. In various embodiments, smelting optimization component 122 can store and/or retrieve data from shared storage 124 and local storage 108. For example, smelting optimization component 122 will store image annotation information to shared storage 124 and access previously stored image annotation information to assist in future image annotation assignments. In various embodiments, smelting optimization component 122 can have cognitive capabilities and learn from previous files and/or data that smelting optimization component 122 has interacted with previously, and/or has stored to local storage 108 and/or shared storage 124. For example, retrieving and analyzing previously accessed smelting data from a year ago. In various embodiments, local storage 108 and/or shared storage 124 can store process data, measurement of 9-box control variables and/or prediction of 9-box control variables.

In various embodiments, smelting optimization component 122 is housed on server computer 120; however, in other embodiments, smelting optimization component 122 can be housed on computing device 110, and/or a computing device and/or server computer not depicted in FIG. 1. In various embodiments, multiple control and signal response component (MCSRC) 126 and predictive modeler component (PMC) 128 are subcomponents of smelting optimization component 122. In various embodiments, MCSRC 126 can collect different types of process data at various resolutions. For example, power related process variables are collected every 30 minutes, noise related process variables, various feeding parameters are collected every 1 hour, and various chemical contents are collected every 45 minutes, etc. In various embodiments, PMC 128 can use a trained model and iterative algorithm, and takes multi-modality and multi-resolution time series, to predict control variables. For example, temperature and regulation of Alumina Fluoride, the model in this particular example, is trained based on historical process data and historical measurements of temperature and Alumina Fluoride. In a more detailed example, recalling that the optimal Alumina Smelting temperature is 1010 degrees Celsius (° C.) and the optimal time sequence for measuring temperature is every 30 minutes, and maintaining the 1010° C. Alumina Smelting temperature by monitoring the Alumina Smelting temperature every 30 minutes and adding/feeding a predetermined amount of Alumina Fluoride to the Alumina Smelting process in order to maintain a consistent temperature of 1010° C.

In one example, challenges of current control practice occur during manufacturing processes utilizing aluminum fluoride. In this particular example, temperature and aluminum fluoride are measured manually and consume operational resources due to corrosive nature of the plant. The measurements are collected in large time intervals, (e.g., every 50-100 hours), since it requires long laboratory analysis. However, the predicted temperature and aluminum fluoride can prompt 9-box control in a finer granularity, proactively response to the abnormal process conditions, improve productivity by reducing energy consumption, and reduce process variation and abnormal events, such as electrical shorting and reoxidation of aluminum.

In various embodiments, predictive modeler 128, depicted in equation 1, can impose the view consistency and resolution coherence in the regularizer R(•) by comparing the prediction results with the modality/resolution combinations. This is equivalent to comparing the prediction results with the modality/resolution combination with the average over one or more combinations. For example, data from an alumina smelting process comprises 174 process variables, which are collected either every 30 minutes, 2 hours, or 24 hours and includes 4 modalities comprising power, noise, feed, and chemical (e.g., MCSRC 126). In this particular example, to predict the temperature for process control, PMC 128 compares the prediction results with the modality/resolution combinations, and the multi-view regression based on canonical correlation analysis (MVRCCA), in which PMC 128 can individually learn from one or more resolutions.

Figure 2A:
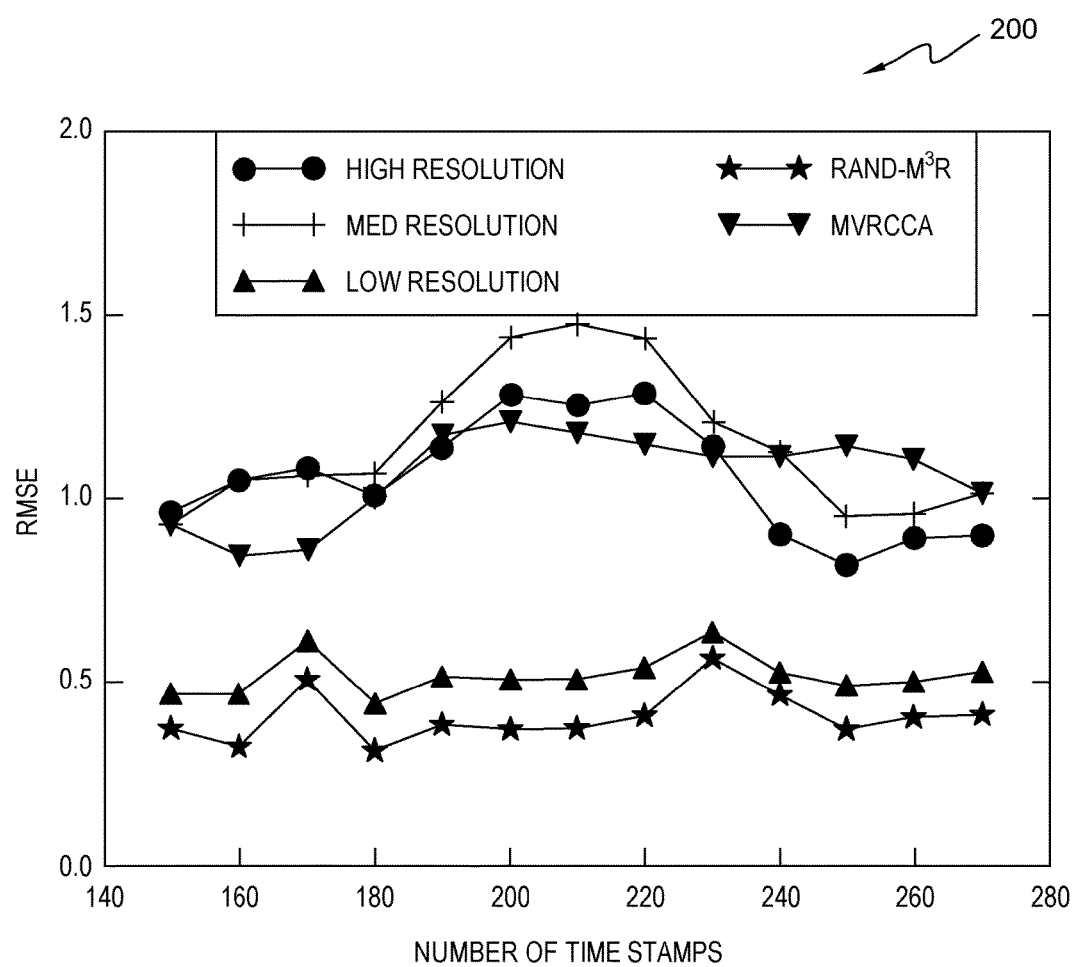
FIG. 2A-2B 2A: presents the improved prediction performance in terms of Root Mean Square Error (RMSE) using multi-modality multi-resolution model compared to existing model for multi-modality regression (MVRCCA) and modeling based on single resolution data (High Resolution, Med Resolution, and Low Resolution); 2B: the prediction model's performance is robust to the regularization parameter gamma ($\gamma$) as the RMSE does not change much given perturbation of gamma in a small range, i.e. 0 to 0.10.
Figure 2B:
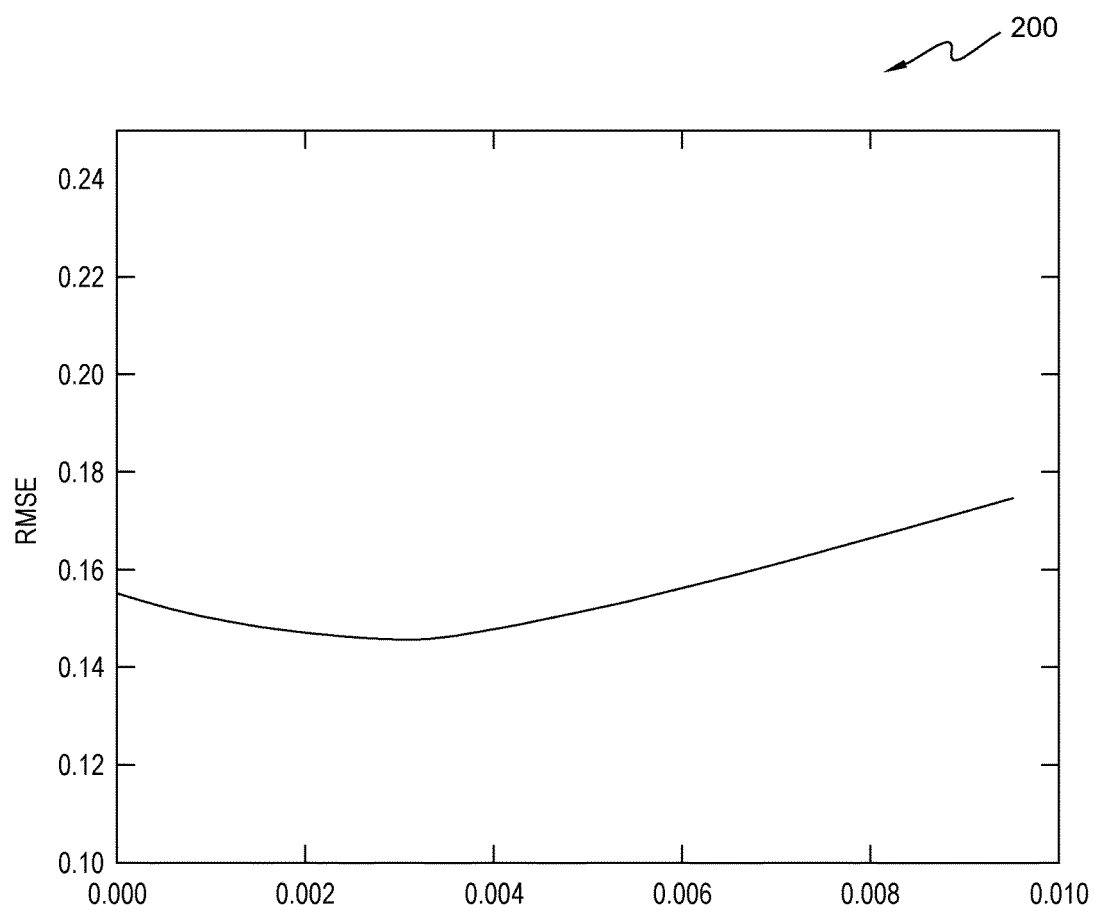

Furthermore, in this particular example, PMC 128 conducts a comparison based on root mean squared error (RMSE), in which the proposed rand- multi-modality multi-resolution (M3R) method enables an enhanced performance, rather than the cognitive learning from one or more resolution individually and the multi-view regression; additionally, rand-M3R is robust to small perturbations in regularization parameter, as seen in FIG. 2A and FIG. 2B. FIG. 2A and FIG. 2B, generally designated 200, provides only one example of one implementation and does not imply any limitations with regard to environment in which different embodiments may be implemented. FIG. 2A illustrates the improved prediction performance in terms of Root Mean Square Error (RMSE) using multi-modality multi-resolution model compared to existing model for multi-modality regression (MVRCCA) and modeling based on single resolution data (High Resolution, Med Resolution, and Low Resolution). FIG. 2B depicts the prediction model's performance to be robust to the regularization parameter gamma ($\gamma$) as the RMSE does not change much given perturbation of gamma in a small range, i.e. 0 to 0.10. Let $x_1, \ldots, x_N$ denote N input process variables (i.e., time series, and $t_1, \ldots, t_N$ denote the elapsed time between adjacent measurement for each time series. Traditional techniques for modeling temporal data assume $t_n = t$, i.e., the data is sampled at the same time stamps for all time series. However, for many real applications, this may not be the case. For example, in aluminum smelting processes, certain variables (electrical noise related variables) may be sampled with a higher frequency (e.g., every 10 seconds), and others (e.g. temperature) may be sampled with a much lower frequency (e.g., every day). We refer this property as the 'multi-resolution' property. Suppose that $t_1, \ldots, t_N$ have a set of L unique values.

$$\min_{\beta_1^{(1)},\ldots,\beta_N^{(L)}} \sum_t \left( y(t) - \frac{1}{\sum_{n=1}^{N}\sum_{l=1}^{L} H_n^{(l)}} \cdot \sum_{l=1}^{L}\sum_{n=1}^{N} H_n^{(l)} \sum_{i=1}^{I^{(l)}} \beta_{n,i}^{(l)} x_n^{(l)}(t - i \times t^{(l)}) \right)^2 +$$

$$R(\beta_1^{(1)}, \ldots, \beta_N^{(L)})$$

Equation 1 depicts the predictive modeling approached used by predictive modeler 128, where ŷ (t) is defined as $$\frac{1}{\sum_{n=1}^{N}\sum_{t=1}^{L} \mathbb{I}_n^{(l)}} \cdot \sum_{l=1}^{L}\sum_{n=1}^{N}\sum_{i=1}^{I} \beta_{n,i}^{(l)} x_n^{(l)}(t - i \times t^{(l)}), \text{ and } \gamma > 0$$

is a weight parameter.

$I^{(l)}$ is the lag for the $l^{th}$ resolution, and R(•) is the proposed regularizer that depends on both the input time series as well as the coefficient vectors defined as follows:

$$R(\beta_1^{(1)}, \ldots, \beta_N^{(L)}) = \gamma \sum_{l,n} \mathbb{I}_n^{(l)} \sum_{t} \left( \sum_{i=1}^{I^{(l)}} \beta_{n,i}^{(l)} x_n^{(l)}(t - i \times t^{(l)}) - \hat{y}(t) \right)^2$$

The objective function consists of two parts. The first part measures the goodness of fit. For each time stamp t, the target output y(t) is estimated by computing the average over at least one of the time series and at least one of the available resolutions. And the second part consists of the regularizer R(•), which is designed in such a way that measures both view consistency and resolution coherence. To be specific, it ensures that the prediction results from different modalities and different resolutions should be similar to each other. Notice that it is significantly different from existing multi-view regularizers in the sense that the different modalities area allowed to have different resolutions, whereas existing regularizers assume (explicitly or implicitly) that all the modalities have the same resolution.

Figure 3:
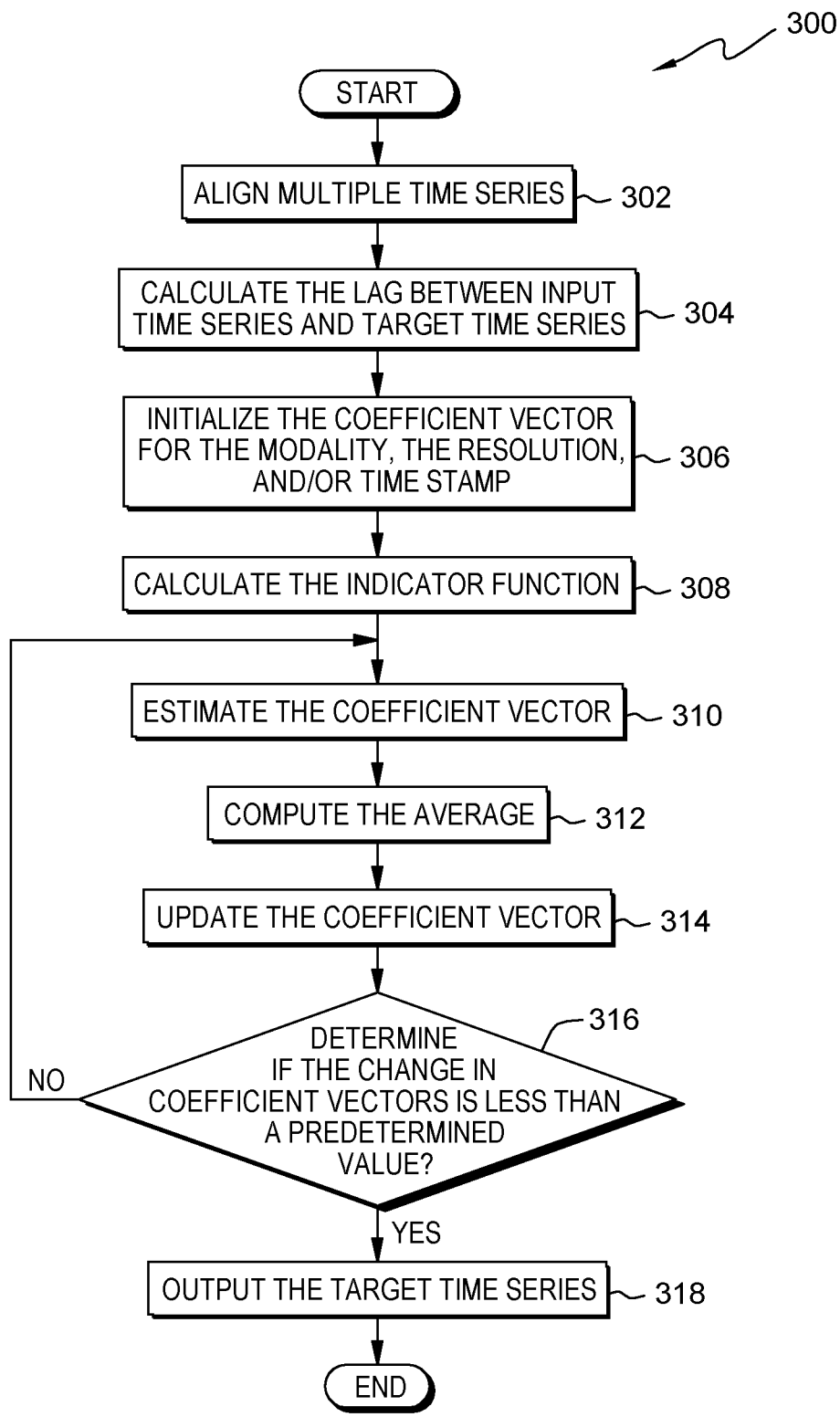
FIG. 3 illustrates operational steps of calibration component, on a client device within the distributed data processing environment of FIG. 1, in accordance with an embodiment of the present invention.

FIG. 3 is a flowchart depicting operational steps of smelting optimization component 122, generally designated 300, on server computer 120 within distributed data processing environment 100 of FIG. 1, in accordance with an embodiment of the present invention. It should be appreciated that FIG. 3 provides only an illustration of one implementation and does not imply any limitations with regard to the environments in which different embodiments can be implemented. Many modifications to the depicted environment can be made.

In step 302, smelting optimization component 122 aligns multiple time series. In other embodiments, smelting optimization component 122 can align one or more time series. In various embodiments, smelting optimization component 122 aligns one or more time series based on adjacent time stamp of the lowest resolution. In various embodiments, smelting optimization component 122 can directly learn from the original time series instead of aggregated data to avoid eliminating data that only exists in high resolution. Additionally, in various embodiments, smelting optimization component 122 does not interpolate among different resolutions to avoid imposing wrong assumption. For example, linear interpolation between data collected every 24 hours and 10 seconds.

In step 304, PMC 128 calculates the lag between input time series and target time series (y(t), e.g. temperature or aluminum fluoride). In various embodiments, PMC 128 and/or smelting optimization component 122 can calculate the lag between input time series and target time series, in which PMC 128 and/or smelting optimization component 122 can directly leveraging cross correlation between target time series and one or more input time series at the original resolutions, which reflects true relationship between the input and target time series.

In step 306, PMC 128 initializes the coefficient vector ($\beta_{n,i}^{l}$) for the modality, the resolution, and/or time stamp. In various embodiments, PMC 128 and/or smelting optimization component 122 can initialize the coefficient vector for the modality, the resolution, and/or time stamp to a set integer. For example, initializing the coefficient vector for the modality, the resolution, and time stamp to zero.

In step 308, PMC 128 calculates the indicator function. In various embodiments, PMC 128 can set the corresponding indicator function $\mathbb{I}_n^{(L)}$ as 1 when the $n^{th}$ modality on the $l^{th}$ resolution is available. In various embodiments, PMC 128 and/or smelting optimization component 122 can calculate one or more indicator functions based on data availability at modality and resolution. In various embodiments, PMC 128 and/or smelting optimization component can jointly learn from one or more modalities and resolutions to improve prediction accuracy.

In step 310, PMC 128 estimates the coefficient vector. In various embodiments, PMC 128 and/or smelting optimization component 122 can estimate the coefficient vector and minimize the difference between target time series and the prediction. Additionally, in various embodiments, PMC 128 and/or smelting optimization component 122 can estimate the coefficient vector for one or more resolution, modality, and/or lag by minimizing the difference between the target time series and the average of available modalities, resolutions, and/or lags over one or more time stamps.

In step 312, PMC 128 computes the average. In various embodiments, PMC 128 and/or smelting optimization component 122 can compute the average (y(t)) over one or more modalities, and/or one or more resolutions, for one or more stamp t.

In step 314, PMC 128 can update the coefficient vector. In various embodiments, PMC 128 and/or MCSR 126 can update the coefficient vector for one or more resolution, modality, and/or lag by minimizing the difference between the prediction results and the average. Additionally, in various embodiments, PMC 128 and/or MCSR 126 can impose prediction consistence among multiple (e.g., one or more) modalities and enhance coherence between resolutions to improve prediction accuracy.

In step 316, PMC 128 determines if the change in coefficient vectors is less than a predetermined value. In various embodiments, PMC 128 and/or smelting optimization component 122 can determine if the change in coefficient vectors is less than a predetermined value, in which PMC 128 and/or smelting optimization component 122 are responsive to the change in coefficient vectors. In this particular example, if the change in coefficient vectors is higher than the predetermined value (No branch) PMC 128 can repeat steps 310 through 316; however, if PMC 128 determines the change of coefficient vectors is less than the predetermined value (Yes branch), PM will advance to step 318.

In step 318, MCSR 126 outputs the target time series. In various embodiments, MCSR 126 and/or smelting optimization component 122 can output one or more target time series and/or provide data to control mechanism 102 and/or 9-box control. For example, outputting the temperature of the aluminum smelting process for control and instructions on how much Alumina Fluoride to feed into the cell (e.g., pot) for smelting. In various embodiments, MCSR 126 can output the target time series to a user as a notification of the update information/data. In various embodiments, MCSR 126 can output the target time series as a prompt to a user and request a user's response to the output notification. In other embodiments, MCSR 126 can output target time series and act on the information/data automatically.

Figure 4:
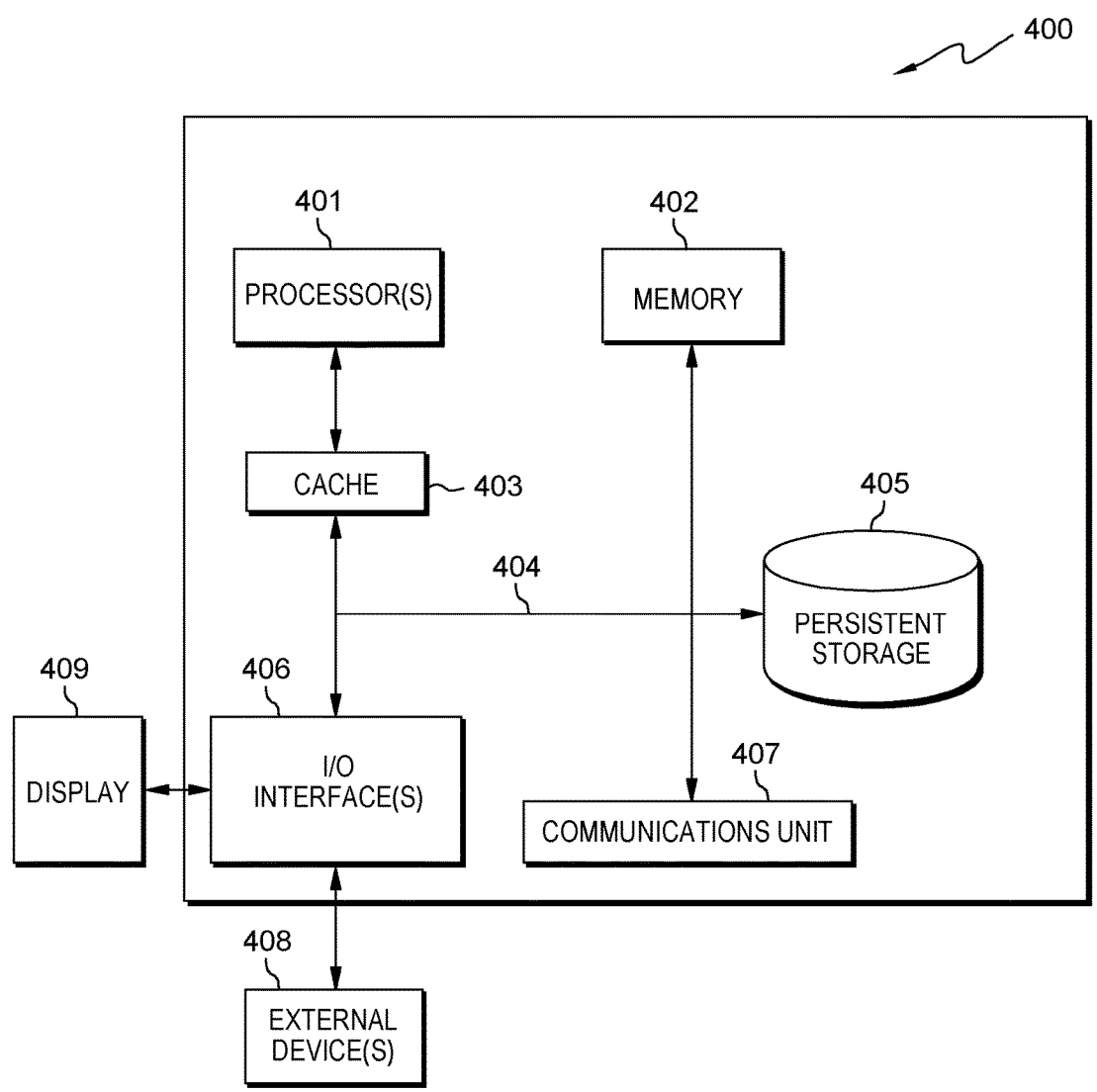
FIG. 4 depicts a block diagram of components of the server computer executing the calibration component within the distributed data processing environment of FIG. 1, in accordance with an embodiment of the present invention.

FIG. 4 depicts a block diagram of components of server computer 104 within distributed data processing environment 100 of FIG. 1, in accordance with an embodiment of the present invention. It should be appreciated that FIG. 4 provides only an illustration of one implementation and does not imply any limitations with regard to the environments in which different embodiments can be implemented. Many modifications to the depicted environment can be made.

FIG. 4 depicts a block diagram of components of a computing device within distributed data processing environment 100 of FIG. 1, in accordance with an embodiment of the present invention. It should be appreciated that FIG. 3 provides only an illustration of one implementation and does not imply any limitations with regard to the environments in which different embodiments can be implemented. Many modifications to the depicted environment can be made.

FIG. 4 depicts computer system 400, where server computer 102 represents an example of computer system 400 that includes smelting optimization component 122. The computer system includes processors 401, cache 403, memory 402, persistent storage 405, communications unit 407, input/output (I/O) interface(s) 406 and communications fabric 404. Communications fabric 404 provides communications between cache 403, memory 402, persistent storage 405, communications unit 407, and input/output (I/O) interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processors 401 by holding recently accessed data, and data near recently accessed data, from memory 402.

Program instructions and data used to practice embodiments of the present invention may be stored in persistent storage 405 and in memory 402 for execution by one or more of the respective processors 401 via cache 403. In an embodiment, persistent storage 405 includes a magnetic hard disk drive. Alternatively, or in addition to a magnetic hard disk drive, persistent storage 405 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405.

Communications unit 407, in these examples, provides for communications with other data processing systems or devices. In these examples, communications unit 407 includes one or more network interface cards. Communications unit 407 may provide communications through the use of either or both physical and wireless communications links. Program instructions and data used to practice embodiments of the present invention may be downloaded to persistent storage 405 through communications unit 407.

I/O interface(s) 406 enables for input and output of data with other devices that may be connected to each computer system. For example, I/O interface 406 may provide a connection to external devices 408 such as a keyboard, keypad, a touch screen, and/or some other suitable input device. External devices 408 can also include portable computer readable storage media such as, for example, thumb drives, portable optical or magnetic disks, and memory cards. Software and data used to practice embodiments of the present invention can be stored on such portable computer readable storage media and can be loaded onto persistent storage 405 via I/O interface(s) 406. I/O interface(s) 406 also connect to display 409.

Display 409 provides a mechanism to display data to a user and may be, for example, a computer monitor.

What is claimed is:

1. A method for optimizing aluminum smelting control, the method comprising:
   aligning, by one or more processors, multiple time series;
   calculating, by the one or more processors, an indicator function;
   estimating, by the one or more processors, a coefficient vector based on the indicator function;
   updating, by the one or more processors, the coefficient vector;
   determining, by the one or more processors, if a change in the coefficient vector is less than a predetermined value; and
   responsive to determining the change in the coefficient vector is less than the predetermined value, outputting, by the one or more processors, a target time series for controlling aluminum smelting.

2. The method of claim 1 further comprising:
   calculating, by the one or more processors, a lag between one or more input time series and the target time series.

3. The method of claim 2 further comprising:
   initializing, by the one or more processors, coefficient vector for at least one of: modality, resolution, or time stamp.

4. The method of claim 3 further comprising:
   computing, by the one or more processors, an average of at least one of: modality, resolution, or time stamp.

5. The method of claim 2, wherein the calculating the lag between the one or more input time series and the target time series further comprises, directly leveraging cross correlation between the target time series and the one or more input time series at one or more predetermined resolutions.

6. The method of claim 1, wherein the aligning of multiple time series further comprises: aligning one or more time series based on adjacent time stamp of a lowest resolution.

7. The method of claim 1, wherein updating the coefficient vector further comprises, updating the coefficient vector for at least one of a one or more resolutions, modality, or lag by minimizing a difference between a prediction results and the average.

8. A computer program product for optimizing aluminum smelting control, the computer program product comprising:
one or more computer readable storage devices and program instructions stored on the one or more computer readable storage devices, the stored program instructions comprising:
program instructions to align multiple time series;
program instructions to calculate an indicator function;
program instructions to estimate a coefficient vector based on the indicator function;
program instructions to update the coefficient vector;
program instructions to determine if a change in the coefficient vector is less than a predetermined value; and
responsive to determining the change in the coefficient vector is less than the predetermined value, program instructions to output a target time series for controlling aluminum smelting.

9. The computer program of claim 8 further comprising:
program instructions to calculate a lag between one or more input time series and the target time series.

10. The computer program of claim 9 further comprising:
program instructions to initialize coefficient vector for at least one of modality, resolution, or time stamp.

11. The computer program of claim 10 further comprising:
program instructions to compute an average of at least one of: modality, resolution, or time stamp.

12. The computer program of claim 9, wherein program instructions to calculate the lag between the one or more input time series and the target time series further comprises, directly leveraging cross correlation between the target time series and the one or more input time series at one or more predetermined resolutions.

13. The computer program of claim 8, wherein the aligning of multiple time series further comprises: aligning one or more time series based on adjacent time stamp of a lowest resolution.

14. The computer program of claim 8, wherein updating the coefficient vector further comprises, updating the coefficient vector for at least one of a one or more resolutions, modality, or lag by minimizing a difference between a prediction results and an average.

15. A computer system for optimizing aluminum smelting control, the computer system comprising:
one or more computer processors;
one or more computer readable storage devices;
program instructions stored on the one or more computer readable storage devices for execution by at least one of the one or more computer processors, the stored program instructions comprising:
program instructions to align multiple time series;
program instructions to calculate an indicator function;
program instructions to estimate a coefficient vector based on the indicator function;
program instructions to update the coefficient vector;
program instructions to determine if a change in the coefficient vector is less than a predetermined value; and
responsive to determining the change in the coefficient vector is less than the predetermined value, program instructions to output a target time series for controlling aluminum smelting.

16. The computer system of claim 15 further comprising:
program instructions to calculate a lag between one or more input time series and the target time series.

17. The computer system of claim 16 further comprising:
program instructions to initialize coefficient vector for at least one of modality, resolution, or time stamp.

18. The computer system of claim 17 further comprising:
program instructions to compute an average of at least one of: modality, resolution, or time stamp.

19. The computer system of claim 16, wherein program instructions to calculate the lag between the one or more input time series and the target time series further comprises, directly leveraging cross correlation between the target time series and the one or more input time series at one or more predetermined resolutions.

20. The computer system of claim 15, wherein the aligning of multiple time series further comprises: aligning one or more time series based on adjacent time stamp of a lowest resolution.

* * * * *